US010012036B2

(12) United States Patent
Goodman et al.

(10) Patent No.: US 10,012,036 B2
(45) Date of Patent: Jul. 3, 2018

(54) DOWNHOLE ELECTRONIC ASSEMBLIES

(71) Applicant: Halliburton Energy Services, Inc., Houston, TX (US)

(72) Inventors: George David Goodman, Phoenixville, PA (US); Robert Eric Epstein, Chester, PA (US); J. Michael Wittig, Fort Collins, CO (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 396 days.

(21) Appl. No.: 14/760,734

(22) PCT Filed: Sep. 19, 2014

(86) PCT No.: PCT/US2014/056470
§ 371 (c)(1),
(2) Date: Jul. 14, 2015

(87) PCT Pub. No.: WO2016/043766
PCT Pub. Date: Mar. 24, 2016

(65) Prior Publication Data
US 2016/0265289 A1  Sep. 15, 2016

(51) Int. Cl.
*E21B 19/00* (2006.01)
*H05K 7/14* (2006.01)
(Continued)

(52) U.S. Cl.
CPC ............ *E21B 19/00* (2013.01); *E21B 47/011* (2013.01); *H05K 7/1405* (2013.01); *E21B 47/00* (2013.01); *E21B 47/024* (2013.01); *E21B 49/00* (2013.01)

(58) Field of Classification Search
CPC ...... E21B 19/00; E21B 47/011; E21B 47/024; E21B 47/00; E21B 49/00; H05K 7/1405
See application file for complete search history.

(56) References Cited

U.S. PATENT DOCUMENTS 4,400,858 A * 8/1983 Goiffon ................. E21B 47/011
138/108
4,479,383 A * 10/1984 Bravenec ............... E21B 36/003
73/152.01
(Continued)

FOREIGN PATENT DOCUMENTS

WO  WO-2013076621 A1 * 5/2013 ............ E21B 47/011

OTHER PUBLICATIONS

International Search Report and Written Opinion for PCT/US2014/056470 dated May 29, 2015.

*Primary Examiner* — Michael R Wills, III
(74) *Attorney, Agent, or Firm* — McDermott Will & Emery LLP

(57) ABSTRACT

Downhole electronics assemblies including a modular carrier including a top rail and a bottom rail, the top and bottom rails each including a pair of longitudinally extending sides and the top rail providing one or more ribs that extend between the longitudinally extending sides of the top rail. A circuit board is positionable between the top and bottom rails and has a top side and a bottom side and one or more electronic components mounted on at least one of the top and bottom sides. One or more damping pads interpose the circuit board and a host downhole tool such that contact between the circuit board and the host downhole tool is prevented.

20 Claims, 4 Drawing Sheets

(51) Int. Cl.
*E21B 47/01* (2012.01)
*E21B 47/00* (2012.01)
*E21B 47/024* (2006.01)
*E21B 49/00* (2006.01)

(56) References Cited

U.S. PATENT DOCUMENTS

| | | | | |
|---|---|---|---|---|
| 4,547,833 | A | * | 10/1985 | Sharp ................ B60B 33/045 174/544 |
| 4,679,250 | A | * | 7/1987 | Davis ................ G02B 6/4448 165/80.3 |
| 4,768,286 | A | | 9/1988 | Ketcham |
| 6,012,537 | A | | 1/2000 | Rountree et al. |
| 6,079,332 | A | * | 6/2000 | Marshall ................ F42B 3/121 102/202.14 |
| 7,615,712 | B2 | * | 11/2009 | Hanley ................ H05K 3/301 174/521 |
| 8,665,597 | B2 | * | 3/2014 | Lee ................ F21V 29/20 361/704 |
| 8,922,988 | B2 | * | 12/2014 | Swett ................ H05K 5/0213 361/679.36 |
| 2005/0263668 | A1 | | 12/2005 | Thigpen et al. |
| 2006/0022887 | A1 | | 2/2006 | Bittar et al. |
| 2006/0043635 | A1 | * | 3/2006 | Groth ................ B29C 33/3835 264/219 |
| 2007/0212817 | A1 | | 9/2007 | Sato et al. |
| 2012/0084008 | A1 | | 4/2012 | Zhan et al. |
| 2013/0235537 | A1 | | 9/2013 | Swett et al. |
| 2014/0312752 | A1 | * | 10/2014 | Durisotti ................ E21B 47/011 312/237 |
| 2015/0275652 | A1 | * | 10/2015 | Fanini ................ E21B 47/01 166/381 |

* cited by examiner

DOWNHOLE ELECTRONIC ASSEMBLIES

BACKGROUND

The present disclosure is related to packaging and transport of electronic equipment used in the oil and gas industry and, more particularly, to downhole electronic assemblies that can be secured to various downhole tools for downhole use.

In the exploration and production of hydrocarbons, various downhole tools are frequently lowered into a borehole, such as drilling assemblies, measurement tools, and production devices. Such downhole tools often include electronic equipment and modules used for various purposes, such as controlling the downhole tools, communicating with a surface location, and storage and analysis of monitored wellbore data. Such electronic modules typically include circuit boards, such as printed circuit boards (PCBs) that are packaged to provide protection from harsh downhole environmental conditions, such as elevated temperatures and pressures, vibration, thermo-mechanical stresses, and thermal shock. Prior to being installed in a downhole tool for use, electronic modules must also be capable of surviving transport and field handling without premature failures resulting from shock and vibration.

Conventional approaches to packaging downhole electronic modules include "potting" the electronic modules in a foam or silicone substance. While potting is a viable solution for surviving harsh downhole environments, it is subject to potential manufacturing and field maintenance problems. For example, after a significant investment in building and testing the electronic modules, they can become damaged beyond repair during the subsequent foaming/potting process. When the potting cures, for instance, it can move wires and/or place stress on various electronic components of the circuit board, thereby increasing the failure rate of the circuit board.

Another conventional approach to packaging a downhole electronic module for downhole use includes wet-mounting the electronic module in a particular downhole tool. Again, this approach may provide a viable downhole solution for withstanding harsh downhole environments, but permanent damage often results from the aggressive procedures required to remove the electronic modules for maintenance or replacement.

In drilling assemblies, packaging downhole electronic modules often includes clamping the circuit boards into a simple edge rail structure. In this configuration, each circuit board acts as a primary support structure, which does not offer adequate strength, stiffness, or mechanical dampening losses to properly retain the electronic components that are mounted to the circuit board. Attempts to retain the circuit boards by bonding them to the underlying downhole tool of the drilling assembly provide some improvement, but complicate removal and reinstallation of the downhole electronic module.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

The present disclosure is related to packaging and transport of electronic equipment used in the oil and gas industry and, more particularly, to downhole electronic assemblies that can be secured to various downhole tools for downhole use.

The embodiments described herein provide downhole electronic assemblies that provide reliable operation in harsh downhole environments without undue impact to their manufacture, module testability, component level reparability, or tool level module replacement. The presently disclosed downhole electronic assemblies include a module carrier having top and bottom rails, a circuit board that can be secured between the top and bottom rails, and a damping pad that interposes the module carrier and a host downhole tool when installed. The modular carrier may function as a robust and otherwise rigid carrying console for the circuit board and its associated electronic components. The modular carrier prevents flexure of the circuit board during manufacturing, testing, and mounting the downhole electronic assemblies to a host downhole tool. Prior to mounting the modular carrier to a host downhole tool, an operator may be able to access both the top and bottom sides of the circuit board, thereby allowing an operator to install, replace, and/or test the electronic components associated with the circuit board.

The presently disclosed downhole electronic assemblies may also prove advantageous in reducing manufacturing and testing costs. For example, the presently disclosed downhole electronic assemblies may require less touch labor to assemble the circuit boards into the corresponding modular carriers as compared to assembling a fully potted module. As a result, fewer modules will be scrapped due to the often-destructive potting process. The disclosed embodiments may be used in downhole tool strings and assemblies to generally enhance high-temperature integrity of electronic components utilized in high temperature downhole operations, such as exploration, formation measurement, measurement while drilling (MWD) and logging while drilling (LWD) applications.

Figure 1:
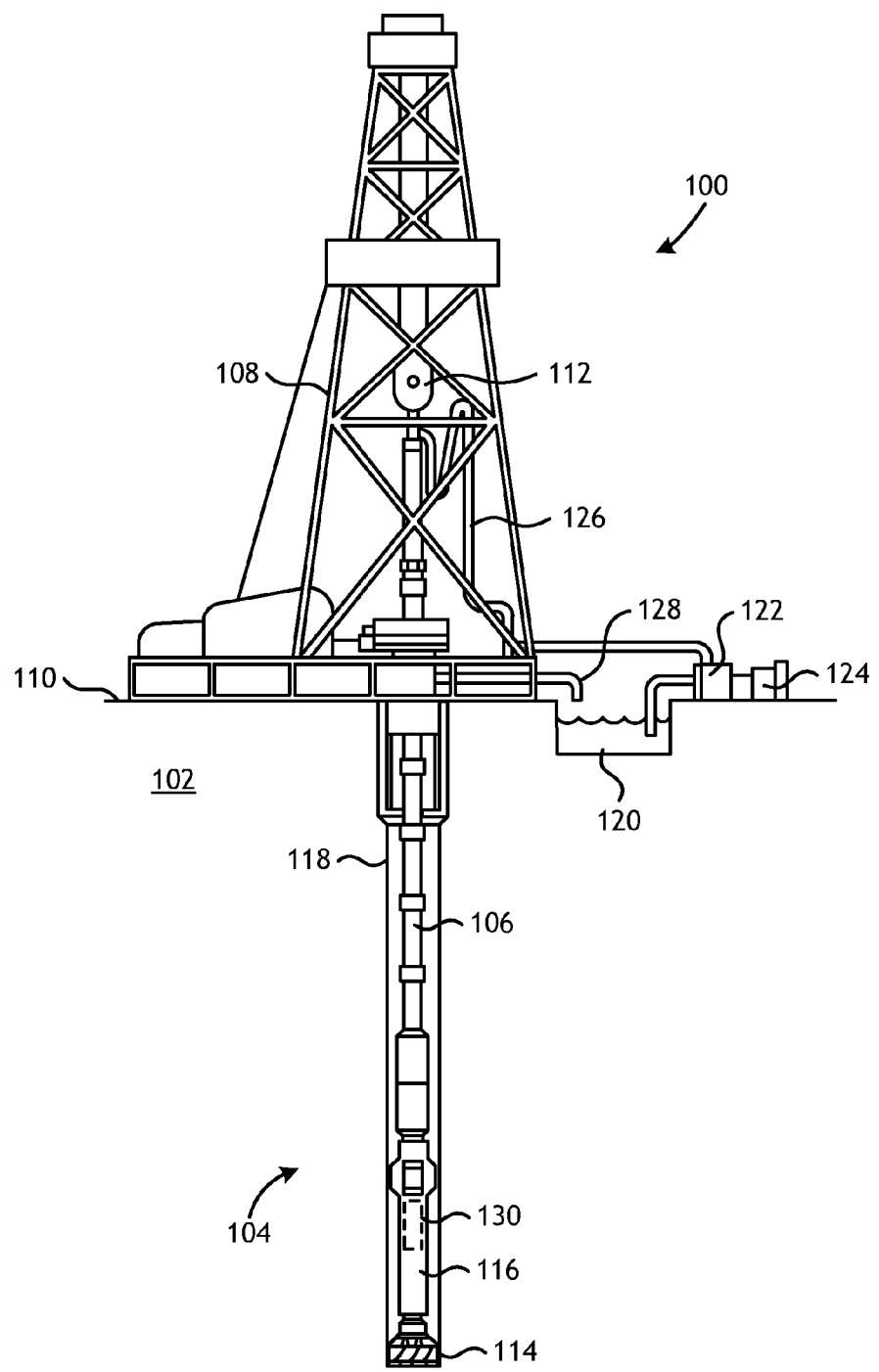
FIG. 1 is schematic diagram of a well system that can employ the principles of the present disclosure.

Referring to FIG. 1, illustrated is an exemplary well system 100 that may employ one or more principles of the present disclosure. In one embodiment, as illustrated, the well system 100 may be a drilling system used to create boreholes in the earth 102. It should be noted that the well system 100 is shown for illustrative purposes in describing the principles of the present disclosure and, therefore, should not be limited only to drilling applications. For instance, in other embodiments, the well system 100 may be a wireline measurement assembly used to measure and report various downhole parameters within already drilled boreholes.

In the illustrated embodiment, the well system 100 may be configured to drive a bottom hole assembly (BHA) 104 positioned or otherwise arranged at the bottom of a drill string 106 extended into the earth 102 from a derrick 108 arranged at the surface 110. The derrick 108 includes a kelly 112 used to lower and raise the drill string 106. The BHA 104 may include a drill bit 114 operatively coupled to a tool string 116 which may be moved axially within a drilled wellbore 118 as attached to the drill string 106.

During operation, the drill bit 114 penetrates the earth 102 and thereby creates the wellbore 118. The BHA 104 provides directional control of the drill bit 114 as it advances into the earth 102. Fluid or "mud" from a mud tank 120 may be pumped downhole using a mud pump 122 powered by an adjacent power source, such as a prime mover or motor 124. The mud may be pumped from the mud tank 120, through a standpipe 126, which feeds the mud into the drill string 106 and conveys the same to the drill bit 114. The mud exits one or more nozzles arranged in the drill bit 114 and in the process cools the drill bit 114. After exiting the drill bit 114, the mud circulates back to the surface 110 via the annulus defined between the wellbore 118 and the drill string 106, and simultaneously returns drill cuttings and debris to the surface. The cuttings and mud mixture are passed through a flow line 128 and are processed such that a cleaned mud is returned down hole through the standpipe 126 once again.

The tool string 116 can include various downhole tools used to help facilitate the drilling operation. For instance, the tool string 116 may include formation evaluation sensors and directional sensors, such as measuring-while-drilling (MWD) and/or logging-while-drilling (LWD) tools. The tool string 116 may further include one or more telemetry devices used to communicate with a surface location. Data obtained by the MWD and LWD tools may be encoded and transmitted to the surface via the telemetry device. The downhole tools of the tool string 116 may be connected to suitable electronics for receiving sensor measurements, storing or transmitting data, analyzing data, controlling the drill bit 114 and/or performing other functions. Such electronics may be included in a downhole electronics assembly 130 incorporated as part of the tool string 116.

As described herein, the downhole electronics assembly 130 may include the necessary electronic components and modules to operate one or more of the downhole tools of the tool string 116. For instance, the downhole electronics assembly 130 may include one or more circuit boards and various electronic modules mounted to the circuit boards. It should be noted that although the embodiments described herein are discussed in the context of circuit boards, the embodiments might be used in conjunction with any electronic component or module that might benefit from a packaging or housing having high damping, high thermal conduction, and low fatigue stress. Furthermore, although the downhole electronics assembly 130 is described herein as being used in conjunction with the tool string 116 and its various downhole tools, the downhole electronics assembly 130 may equally be employed in other high temperature and/or vibration-prone environments, without departing from the scope of the disclosure.

Figure 2A:
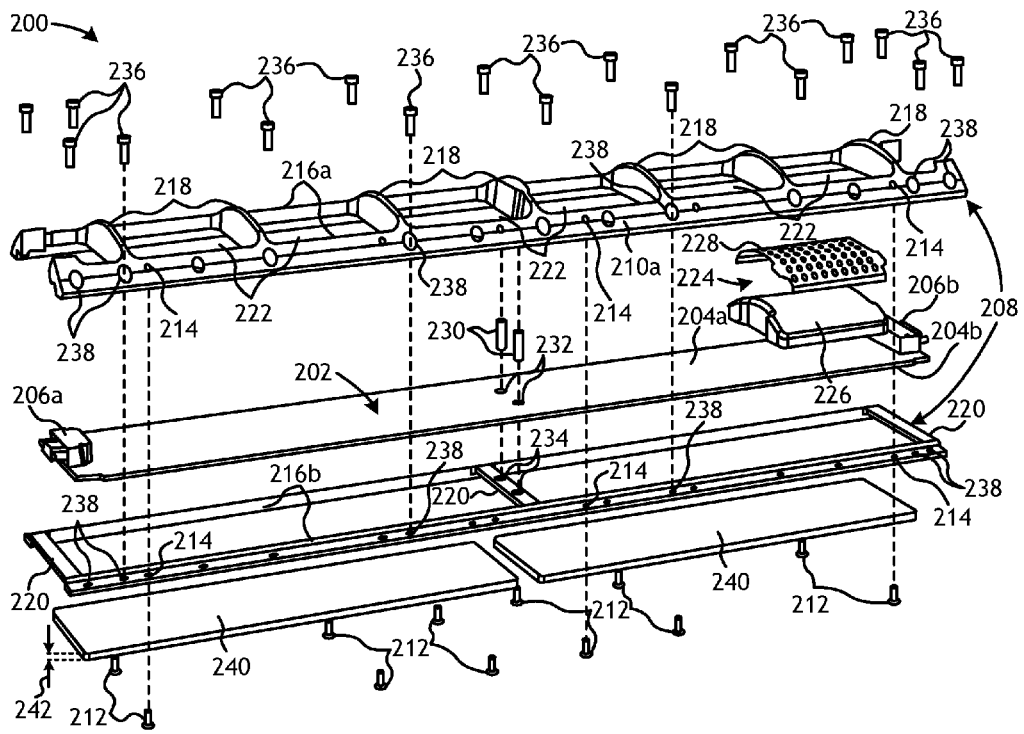
FIGS. 2A and 2B depict isometric exploded and assembled views, respectively, of a downhole electronic assembly.
Figure 2B:
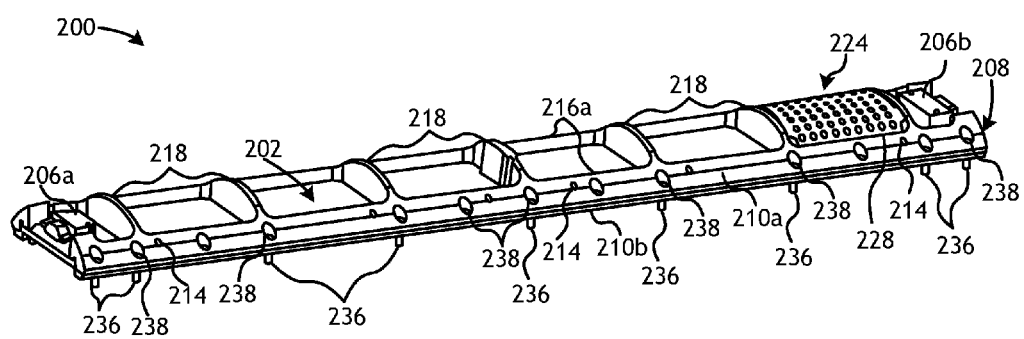

Referring to FIGS. 2A and 2B, illustrated are isometric exploded and assembled views, respectively, of an exemplary downhole electronics assembly 200, according to one or more embodiments. The downhole electronics assembly 200 (hereafter "the assembly 200") may be the same as or similar to the downhole electronics assembly 130 of FIG. 1 and, therefore, may be configured to be incorporated into a tool string 116 (FIG. 1) and otherwise used to provide electronic support and command functions for one or more downhole tools associated with the tool string 116. As illustrated, the assembly 200 may include a circuit board 202. As used herein, the term "circuit board" is meant to encompass any means for providing interconnections and mounting of electronic components such as, but not limited to, a printed circuit board (PBC), a printed wiring board (PWB), a printed circuit assembly (PCA), a wire-wrap board, a brassboard, a breadboard, and any combination thereof.

The circuit board 202 may have a top side 204a and a bottom side 204b. While not shown in FIGS. 2A and 2B, the circuit board 202 may include one or more electronic modules or components that may be mounted on either or both of the top and bottom sides 204a,b. The circuit board 202 may further include one or more connectors 206 (shown as a first connector 206a and a second connector 206b) used to electrically couple the circuit board 202 (and its associated electronic components) to a downhole tool. In the illustrated embodiment, the circuit board 202 includes two connectors 206a,b positioned at opposing ends of the circuit board 202. In other embodiments, the circuit board 202 may have more or less than two connectors 206 (including only one), without departing from the scope of the disclosure.

The assembly 200 may further include a modular carrier 208 that includes a top rail 210a and a bottom rail 210b. When properly coupled or otherwise assembled to form the modular carrier 208, the top and bottom rails 210a,b may be configured to capture the circuit board 202 therebetween so that the modular carrier 208 may be attached or coupled to a host downhole tool. The top rail 210a may be coupled to the bottom rail 210b via a variety of attachment means. In the illustrated embodiment, for instance, a plurality of mechanical fasteners 212 (FIG. 2A), such as screws or bolts, that may threadably fasten the top rail 210a to the bottom rail 210b. As illustrated, the mechanical fasteners 212 may be extended through a corresponding plurality of holes 214 defined in each of the top and bottom rails 210a,b. When tightened, the mechanical fasteners 212 may serve to secure the top rail 210a to the bottom rail 210b with the circuit board 202 interposing the two components.

In other embodiments, however, the top and bottom rails 210a,b may be coupled using other types of mechanical fasteners, such as pins, rivets, snap rings, etc. In yet other embodiments, the top and bottom rails 210a,b may be coupled by welding, brazing, adhesives, shrink fitting, or any combination of the foregoing attachment means. It will be appreciated, however, that a removable or reversible attachment means may be preferred in coupling the top and bottom rails 210a,b so that an operator may readily access the circuit board 202 (and its associated electronic components) for repair, rehabilitation, or alteration.

The top and bottom rails 210a,b may be made of a variety of rigid or semi-rigid materials. In some embodiments, one or both of the top and bottom rails 210a,b may be made of a metal, such as aluminum, copper, titanium, steel, controlled expansion alloys, any combination thereof, and any other exotic materials as the design requires. In other embodiments, one or both of the top and bottom rails 210a,b may be made of a plastic, a thermoplastic, a polymer, a ceramic, a composite material, any combination thereof, and any other exotic materials as the design requires. In some embodiments, the afore-mentioned materials for the top and bottom rails 210a,b may be filled or impregnated with either conductive particles (e.g., sliver) or magnetically permeable particles (e.g., ferrite) to provide desired properties for special applications.

The top and bottom rails 210a,b may each include a pair of longitudinally extending sides 216, shown as sides 216a for the top rail 210a and sides 216b for the bottom rail 210b. As illustrated, the holes 214 for the mechanical fasteners 212 may be defined through the sides 216a,b and axially alignable to receive the mechanical fasteners 212 and thereby couple the top and bottom rails 210a,b. The top rail 210a may further provide or otherwise define one or more ribs 218 (seven shown) that extend between the sides 216a of the top rail 210a to provide structural rigidity to the top rail 210a and otherwise to secure the sides 216a together. Similarly, the bottom rail 210b may further include one or more transverse members 220 (three shown) that extend between the sides 216b of the bottom rail 210b to provide structural rigidity to the bottom rail 210b and otherwise to secure the sides 216b together. While a particular number of ribs 218 (seven) and transverse members 220 (three) are depicted in FIGS. 2A-2B, it will be appreciated that more or less than what is shown may be employed in the modular carrier 208, without departing from the scope of the present disclosure.

The ribs 218 may serve as both a stiffener and a dampener for the assembly 200 and, more particularly, to the modular carrier 208. As a dampener, the ribs 218 may be able to control the resonant frequency Q (Quality Factor) to dissipate or limit otherwise destructive oscillations to a safe level. The amount of stiffness that the ribs 218 may supply to the assembly 200 may prove advantageous in raising the resonant frequency of the assembly 200 to a desired frequency. For instance, it may be desired to have the assembly 200 exhibit an overall high frequency, since higher frequencies equate to smaller displacements and, therefore, less mechanical stress or vibration will be assumed by the circuit board 202 at a high frequency. It may also be desired that the assembly 200 exhibit a frequency that is not resonant with an adjacent host downhole tool. Consequently, it is desirable to place the resonant frequency of the assembly 200 above the cutoff frequency for its host downhole tool since the transfer function of the host downhole tool often cannot impart significant energy at the resonant frequency of the assembly 200. Accordingly, in at least one embodiment, the size, shape, and/or structural dimensions of one or more of the ribs 218 may be optimized or otherwise designed such that the assembly 200 reaches a desired frequency in downhole operation and the natural frequency of the modular carrier 208 does not coincide with other resonances exhibited by the host downhole tool.

In the illustrated embodiment, the ribs 218 may be arched between the sides 216a to improve rigidity and otherwise to better conform to available space above the assembly 200, which is typically rounded when mounted to a host downhole tool. As described in more detail below, in some embodiments, a flexible gasket or damping pad may interpose the circuit board 202 and each rib 218 to dissipate vibration and accommodate the thermal expansion mismatch between the materials of the circuit board 202 and the top rail 210a.

The structural intersection of the ribs 218 with the sides 216a of the top rail 210a may define or otherwise provide one or more cells 222 (six shown) in the top rail 210a. In some embodiments, the assembly 200 may further include one or more cell damper assemblies 224 (one shown) configured to be secured within the cells 222 of the top rail 210a. While only one cell damper assembly 224 is depicted in FIGS. 2A-2B, it will be appreciated that a cell damper assembly 224 may be secured within each of the cells 222, without departing from the scope of the disclosure. The cell damper assembly 224 may prove advantageous in embodiments where the circuit board 202 includes large or heavy electronic components or modules mounted to the circuit board 202 and extending away from the top side 204a of the circuit board 202. Because of their weight and/or size, such electronic components may be more susceptible to damage from vibration as compared to smaller or lighter electronic components that may be mounted closer to the top side 204a surface of the circuit board 202. The cell damper assembly 224 may be used to mitigate or prevent vibration damage assumed by such large or heavy electronic components or modules. In some embodiments, as discussed below, such larger or heavier electronic components may be secured to an adjacent rib 218.

As illustrated, the cell damper assembly 224 may include a molded pad 226 and a lid 228. In some embodiments, the molded pad 226 may be conformal coated or molded about or around one or more electronic components of the circuit board 202 via any potting process known to those skilled in the art. In other embodiments, the molded pad 226 may be machined or otherwise formed to fit about or around one or more electronic components of the circuit board 202. The molded pad 226 may be made of a variety of materials suitable for dampening vibration that may be assumed during downhole use. Suitable materials for the molded pad 226 include, but are not limited to, rubber, elastomers, polyurethane, epoxy, adhesive, silicone, and silicone-based materials. In some embodiments, the material of the molded pad 226 may be a thermally conductive material having a coefficient of thermal expansion sufficient to reduce or prevent thermoelastic forces from being exerted on electronic component(s) of the circuit board 202 via the molded pad 226.

The lid 228 may be configured to firmly secure the molded pad 226 in place about or around the one or more electronic components of the circuit board 202. In some embodiments, the lid 228 may be snapped or clamped into place within a corresponding cell 222 of the top rail 210a. In other embodiments, however, the lid 228 may be mechanically fastened within the corresponding cell 222 of the top rail 210a using, for example, one or more mechanical fasteners (e.g., screws, bolts, snap rings, pins, rivets, etc.). In yet other embodiments, the lid 228 may be permanently or semi-permanently secured within a cell 222 by brazing, welding, or shrink fitting the lid 228 into place. The lid 228 may be made of a variety of materials including, but not limited to, a metal (e.g., aluminum, copper, steel, or any alloy thereof), a plastic, a thermoplastic, a polymer, a composite material, rubber, an elastomer, or any combination thereof. In some embodiments, the lid 228 may be embedded within the molded pad 226 as a single subassembly to provide structural support. In other embodiments, the lid 228 may be omitted from the assembly 200, depending on the materials used and the required vibration environment.

In assembling the modular carrier 208, one or more alignment pins 230 (two shown) may be used to help accurately locate the circuit board 202 between the top and bottom rails 210a,b. The alignment pin(s) 230 may be configured to extend through holes 232 defined through the circuit board 202 and further be located in corresponding holes 234 defined in the top and bottom rails 210a,b. In the illustrated embodiment, the holes 234 may be defined in the bottom rail 210b and, more particularly, in one of the transverse members 220 for receiving one end of the alignment pin(s) 230. Similar holes (not shown) may be defined in the top rail 210a and, more particularly, in the bottom-side of one of the ribs 218 for receiving the opposing end of the alignment pin(s) 230.

When the top and bottom rails 210a,b are properly coupled, as described above, the modular carrier 208 may function as a robust and otherwise rigid carrying console for the circuit board 202 and its associated electronic components and modules mounted thereon. For instance, PCBs and PWBs typically have a long and thin aspect ratio, which makes them prone to mechanical failures when lifted at one end and resulting in excessive flexure of the board. The modular carrier 208, however, provides a carrier structure that avoids flexing of the circuit board 202 during manufacturing, testing, and mounting to a host downhole tool. The modular carrier 208 also provides a roll-cage like structure that provides accidental impact damage protection. As a roll-cage structure, the modular carrier 208 may serve as a protective guard that is able to protect its internal components if dropped or placed on a rough surface.

The modular carrier 208 may also provide an electrostatic shield for electrostatic discharge (ESD) protection of sensitive components on the circuit board 202. The modular carrier 208 may be connected to the ground of the circuit board 202 and thereby assumes the same potential as the surface (bench) on which it is placed. An individual will naturally touch the modular carrier 208 first during handling providing a harmless discharge of any potential on their body. However, even if they do not touch the guard first, strong electric field flux lines will terminate on the modular carrier 208 as their hand approaches the assembly reducing an impact to ESD-sensitive electronics.

Prior to mounting the modular carrier 208 to a host downhole tool, an operator may be able to access both the top and bottom sides 204a,b of the circuit board 202. As a result, the operator may be able to install, replace, and/or test the electronic modules or components that may be mounted on either or both of the top and bottom sides 204a,b of the circuit board 202.

The modular carrier 208 may be coupled to a host downhole tool (not shown) via a variety of attachment means. In the illustrated embodiment, for instance, a plurality of mechanical fasteners 236, such as screws or bolts, may threadably fasten the modular carrier 208 to the host downhole tool. As illustrated, the mechanical fasteners 236 may be extended through a corresponding plurality of holes 238 defined through each of the top and bottom rails 210a,b. In other embodiments, however, the modular carrier 208 may be coupled to the host downhole tool using other types of mechanical fasteners, such as pins, rivets, snap rings, etc. In yet other embodiments, the modular carrier 208 may be coupled to the host downhole tool by welding, brazing, adhesives, shrink fitting, or any combination of the foregoing attachment methodologies. As with the coupling of the top and bottom rails 210a,b however, a removable or reversible attachment means may be preferred in coupling the modular carrier 208 to the host downhole tool so that an operator may readily detach and remove the modular carrier 208 for repair, rehabilitation, and/or alteration.

In some embodiments, as best seen in FIG. 2A, the assembly 200 may further include one or more damping pads 240 (two shown). The damping pads 240 may be configured to interpose the circuit board 202 and the host downhole tool. In some embodiments, the damping pads 240 may be viscoelastic and thereby provide support and vibration dampening at the interface between the modular carrier 208 and the host downhole tool. The damping pads 240 may be made of a variety of materials including, but not limited to, rubber, an elastomer, polyurethane, an epoxy, silicone, a silicone-based material, and any combination thereof. In some embodiments, the material of the damping pads 240 may be a thermally conductive material that may help conduct thermal energy away from the circuit board 202 and otherwise toward the host downhole tool.

The damping pads 240 may exhibit a depth or thickness 242 sufficient to provide support and dampening to the circuit board 202. The thickness 242 may be optimized for the particular application since it can have an antagonistic relationship between its mechanical dampening properties and its thermal impedance between the circuit board 202 and the underlying heat-sinking mounting surface. In most embodiments, however, the thickness 242 may be sufficient to avoid contact between the electrical components of the circuit board 202 and their associated electrical connection on the underside of the circuit board 202 and the mounting surface of the host downhole tool.

Figure 3A:
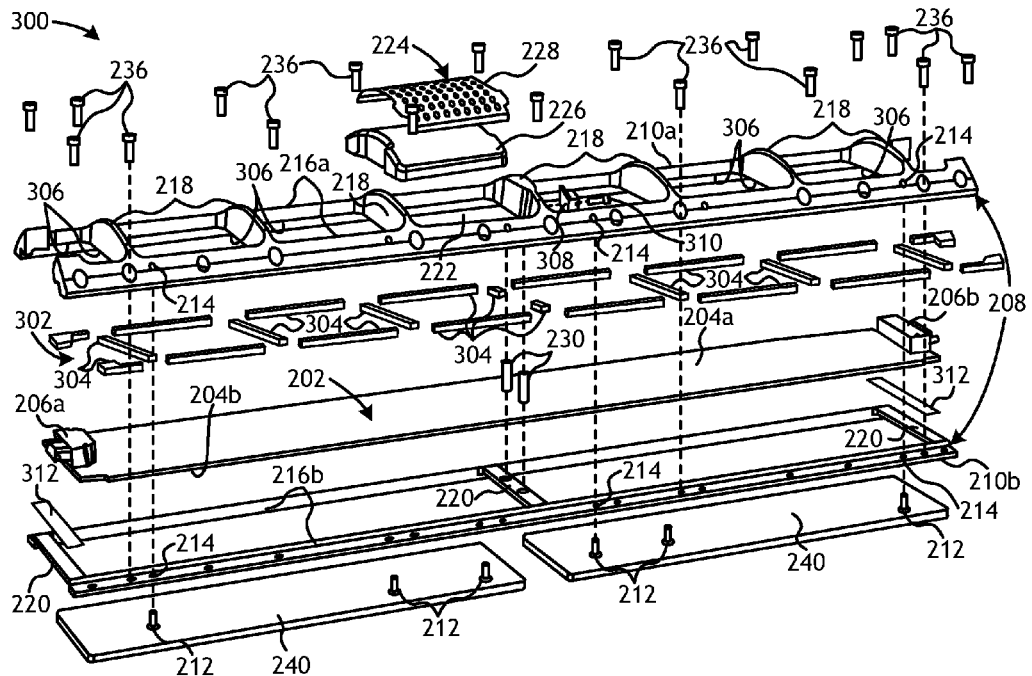
FIGS. 3A and 3B depict isometric exploded and assembled views, respectively, of another downhole electronic assembly.
Figure 3B:
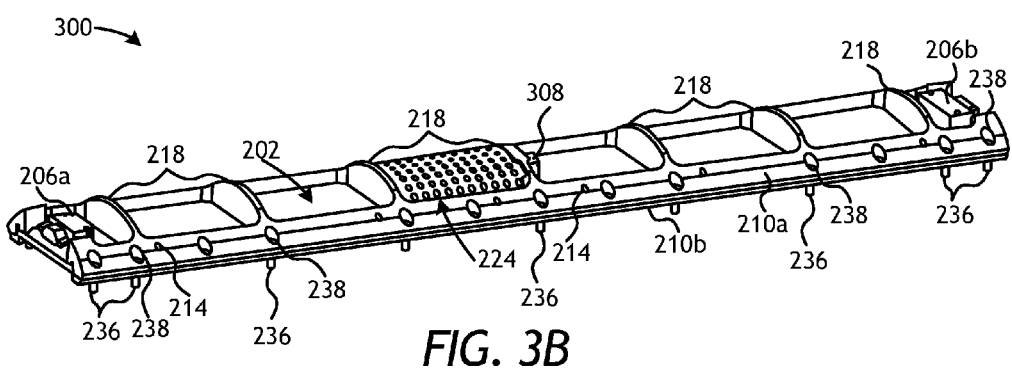

Referring now to FIGS. 3A and 3B, illustrated are isometric exploded and assembled views, respectively, of another exemplary downhole electronics assembly 300, according to one or more embodiments. The downhole electronics assembly 300 (hereafter "the assembly 300") may be similar in some respects to the assembly 200 of FIG. 2 and therefore may be best understood with reference thereto, where like reference numerals correspond to similar components or elements not described again. Similar to the assembly 200 of FIG. 2, the assembly 300 may include the circuit board 202, the connectors 206a,b at each end of the circuit board 202, the modular carrier 208 (including the top and bottom rails 210a,b), and the damping pads 240. Moreover, the top and bottom rails 210a,b may each include the longitudinally extending sides 216a,b, the top rail 210a may include the ribs 218, and the bottom rail 210b may include the transverse members 220. Furthermore, similar to the assembly 200, the assembly 300 may also include the cells 222 defined by the top rail 210a, and one or more cell damper assemblies 224 (one shown) that may be securable within the cells 222.

Unlike the assembly 200, however, the assembly 300 may include an intermediate damping pad 302 that generally interposes the top rail 210a and the circuit board 202. More particularly, the intermediate damping pad 302 may be configured to interpose the circuit board 202 and the sides 216a and the ribs 218 of the top rail 210a such that the circuit board 202 does not engage the top rail 210a at any location. Similar to the damping pads 240, the intermediate damping pad 302 may be viscoelastic and thereby provide support and vibration dampening at the interface between the top rail 210a and the circuit board 202 to minimize the energy imparted to the electrical components mounted on the circuit board 202. The intermediate damping pad 302 may also prove useful in accommodating the thermal expansion mismatch between the circuit board 202 and the material of the top rail 210a.

In some embodiments, the intermediate damping pad 302 may comprise a continuous gasket structure that extends from one end of the circuit board 202 (e.g., at or near the first connector 206a) to the opposite end of the circuit board 202 (e.g., at or near the second connector 206b). In other embodiments, however, as illustrated, the intermediate damping pad 302 may comprise a plurality of gasket strips 304 sized and otherwise configured to engage particular portions of the sides 216a and the ribs 218 of the top rail 210a. The gasket strips 304 may extend longitudinally and transversely with respect to the circuit board 202 to align with the sides 216a and the ribs 218, respectively, of the top rail 210. More particularly, longitudinally extending gasket strips 304 may be configured to interpose the circuit board 202 and the sides 216a, while transversely extending gasket strips 304 may be configured to interpose the circuit board 202 and the ribs 218.

In at least one embodiment, the sides 216a and ribs 218 of the top rail 210a may define or otherwise provide corresponding recesses 306 configured to receive the intermediate damping pad 302 and, more particularly, the gasket strips 304. In some embodiments, the gasket strips 304 may be secured to or within the recesses 306 with an adhesive or the like.

The intermediate damping pad 302 may be made of the same or similar materials as the damping pads 240. Suitable materials for the intermediate damping pad 302 include, but are not limited to, a rubber, an elastomer, polyurethane, an epoxy, silicone, a silicone-based material, and any combination thereof. In some embodiments, the material of the intermediate damping pad 302 may be a thermally conductive material that may help conduct thermal energy away from the circuit board 202 and to the top rail 210a. Moreover, the size and material of the intermediate damping pad 302 may be selected based on the desired frequency of the assembly 300.

In some embodiments, as briefly mentioned above, the ribs 218 may prove useful in providing a location to secure an electronic component or module included in the circuit board 202. More particularly, the assembly 300 may include at least one electronic component or module 308 that may be secured to a rib 218 using, for example, a mechanical fastener 310 (e.g., a screw, a bolt, a pin, etc.). This may prove advantageous where the electronic module 308 is a large or heavy electronic module, such as field-effect transistor (FET). Because of the large size of electronic module 308, it may be more susceptible to damage from vibration as compared to smaller or lighter electronic components. Securing the electronic module 308 to the rib 218 may prove advantageous in providing a more rigid coupling location, thereby making the electronic module 308 less susceptible to damage from vibration. Mounting the electronic module 308 to the rib 218 may also prove advantageous in allowing the electronic module 308 to utilize the rib 218 as a heat sink and dissipate thermal energy into the rib 218 and the top rail 210a. In some embodiments, the electronic module 308 may be secured to the rib 218 within a given cell 222, and a cell damper assembly 224 may be secured within the given cell 222 to further protect and secure the electronic module 308.

In some embodiments, the assembly 300 may further include one or more insulation strips 312 (two shown as first and second insulation strips 312a,b). The insulation strips 312a,b may be located at each end of the circuit board 202 and may otherwise interpose the circuit board 202 and the transverse members 220 located below the connectors 206a,b. Accordingly, the insulation strips 312a,b may be in contact with the bottom side 204b of the circuit board 202 and the transverse members 220. The insulation strips 312a,b may be configured to provide insulation for any exposed solder joints below the connectors 206a,b.

When the top and bottom rails 210a,b are properly coupled and the modular carrier 208 is coupled or otherwise attached to a host downhole tool, as described above, the circuit board 202 may be placed under compressive loading between the intermediate damping pad 302 and the damping pads 240. The electrical components of the circuit board 202, including the electronic module 308, may be staked for vibration, as known in the art, and, in some embodiments, the circuit board 202 may be conformal coated to provide a moisture barrier.

In embodiments where the top and/or bottom rails 210a,b are made of metal, the modular carrier 208 may prove advantageous in reducing electrostatic discharge (ESD) failures, which commonly occur with PCBs and PWBs.

The circuit board 202 in the assembly 300 may be completely isolated from the metal modular carrier 208, which may be able to provide a first contact surface for handling and relocating the modular carrier 208 without causing ESD damage to the circuit board 202. Once the metal ground structure assumes the electric potential of a new environment, ESD may be substantially prevented. As a result, there will be fewer shop failures and fewer latent field failures with the circuit board 202.

As will be appreciated, the above-described assemblies 200, 300 may prove advantageous in reducing manufacturing and testing costs. For example, the assemblies 200, 300 require less touch labor to assemble the circuit boards 202 into the modular carrier 208 as compared to assembling a fully potted module. As a result, fewer modules will be scrapped due to the often-destructive potting process. Moreover, as briefly mentioned above, the electronic components on either side 204a,b of the circuit board 202 remain accessible to an operator, thereby reducing troubleshooting, repair, and inspection costs.

Figure 4A:
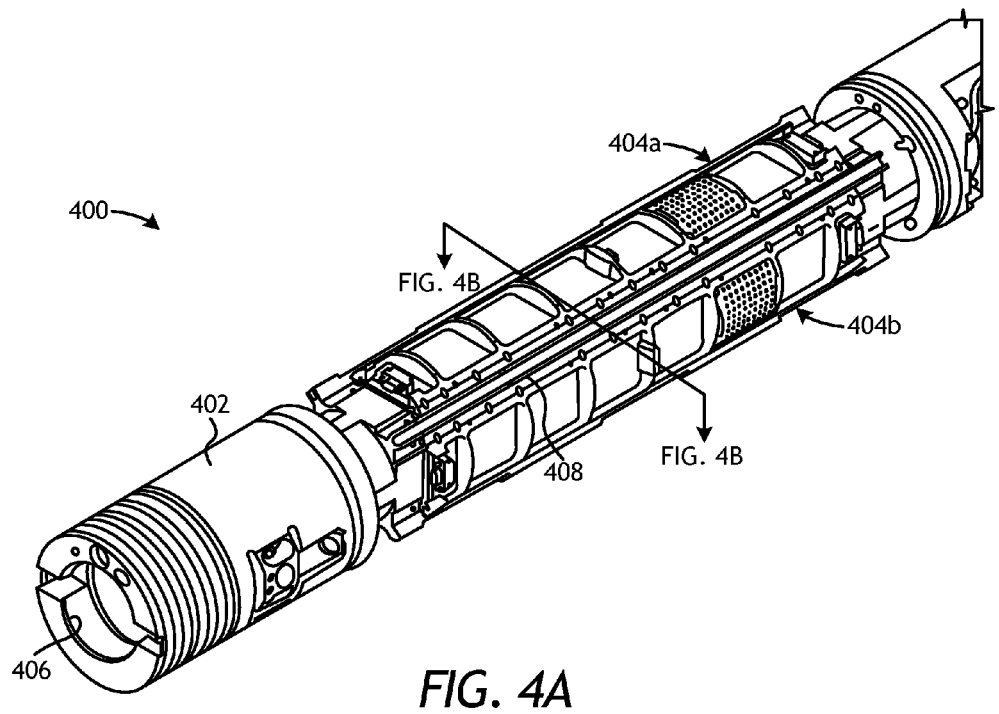
FIGS. 4A and 4B depict isometric and cross-sectional end views, respectively, of an exemplary downhole tool assembly.
Figure 4B:
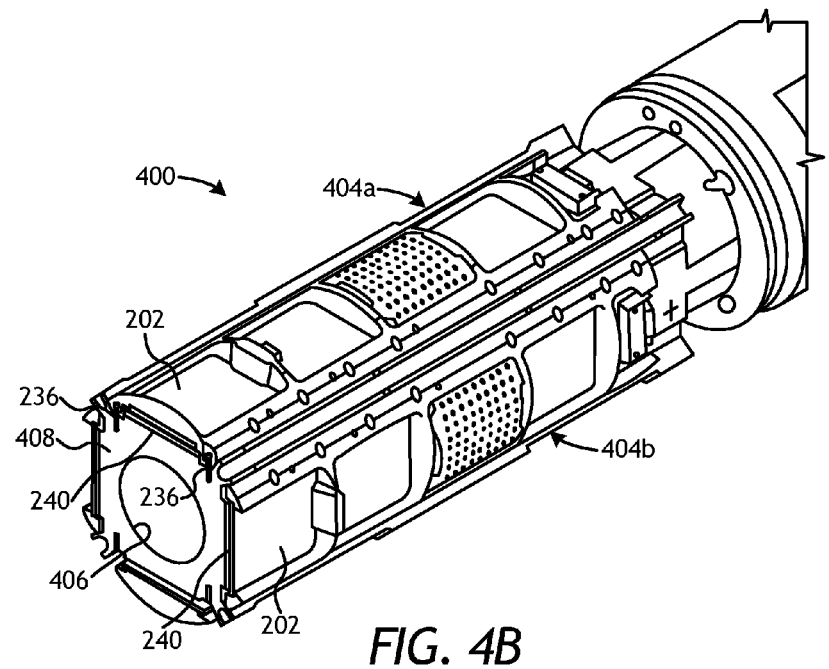

Referring now to FIGS. 4A and 4B, illustrated are isometric and cross-sectional end views, respectively, of an exemplary downhole tool assembly 400, according to one or more embodiments. In some embodiments, the downhole tool assembly 400 may form part of the tool string 116 of FIG. 1. As illustrated, the downhole tool assembly 400 may include a host downhole tool 402 and one or more downhole electronic assemblies 404 (two shown as 404a and 404b) mounted to the host downhole tool 402. In the illustrated embodiment, the host downhole tool 402 may be employed in a drilling application. Accordingly, the host downhole tool 402 may include or otherwise define a central flow passageway 406 for conveying a drilling fluid to an adjacent drill bit. It will be appreciated, however, that the host downhole tool 402 may alternatively be used in other downhole operations and applications, such as wireline measurement operations for measuring and reporting various downhole parameters within a wellbore.

The downhole electronic assemblies 404a,b may be the same as or similar to either of the assemblies 200, 300 described herein with respect to FIGS. 2A-2B and 3A-3B, respectively. As illustrated, the downhole electronic assemblies 404a,b may be secured about the outer circumference of the host downhole tool 402. In other embodiments, the downhole electronic assemblies 404a,b may be secured within the host downhole tool 402, such as within appropriate recesses or locations defined in the inner radial surface of the central flow passageway 406. While only two downhole electronic assemblies 404a,b are fully depicted as being mounted to the host downhole tool 402, it will be appreciated that more or less than two may be employed, without departing from the scope of the disclosure.

In some embodiments, the downhole electronic assemblies 404a,b may be mounted to the host downhole tool 402 by being secured to a receiving element 408. In some embodiments, the receiving element 408 may form an integral part of the host downhole tool 402. In other embodiments, the receiving element 408 may be a subassembly of the host downhole tool 402 and otherwise secured to an outer surface thereof for use. In yet other embodiments, the receiving element 408 may interpose upper and lower axial portions of the host downhole tool 402.

The receiving element 408 may be made of a variety of rigid or semi-rigid materials that may secure the downhole electronic assemblies 404a,b for downhole use. Suitable materials for the receiving element 408 include metals, such as steel or aluminum, but may also include composite materials.

As best seen in FIG. 4B, the downhole electronic assemblies 404a,b may be mechanically fastened to the receiving element 408 using the plurality of mechanical fasteners 236. The damping pads 240 of each downhole electronic assembly may directly contact the receiving element 408 and otherwise interpose the downhole electronic assemblies 404a,b and the receiving element 408. Accordingly, the material for the damping pads 240 may be selected to provide a mechanical damper for vibration to protect the electrical components that may be mounted to the corresponding circuit boards 202. In some embodiments, as mentioned above, the material for the damping pads 240 may also be selected to facilitate thermal conductivity for heat transfer from the electrical components to spread into the underlying host downhole tool 402. Moreover, the material for the damping pads 240 may also provide electrical insulation and dielectric isolation between the circuit board 202 and the underlying host downhole tool 402.

Embodiments disclosed herein include:

A. A downhole electronics assembly that includes a modular carrier including a top rail and a bottom rail, the top and bottom rails each including a pair of longitudinally extending sides and the top rail providing one or more ribs that extend between the longitudinally extending sides of the top rail, a circuit board positionable between the top and bottom rails, the circuit board having a top side and a bottom side and one or more electronic components mounted on at least one of the top and bottom sides, and one or more damping pads configured to interpose the circuit board and a host downhole tool such that contact between the circuit board and the host downhole tool is prevented.

B. A well system that includes a tool string extendable within a wellbore, the tool string including a host downhole tool, at least one modular carrier mounted to the host downhole tool and including a top rail and a bottom rail, the top and bottom rails each including a pair of longitudinally extending sides and the top rail providing one or more ribs that extend between the longitudinally extending sides of the top rail, a circuit board secured between the top and bottom rails and having a top side and a bottom side, wherein one or more electronic components are mounted on at least one of the top and bottom sides, and one or more damping pads interposing the circuit board and the host downhole tool such that contact between the circuit board and the host downhole tool is prevented.

C. A method that includes introducing a tool string into a wellbore, the tool string including a host downhole tool, providing electronic support for the tool string with a downhole electronics assembly mounted to the host downhole tool, the downhole electronics assembly including a modular carrier having a top rail and a bottom rail, and a circuit board secured between the top and bottom rails and having a top side and a bottom side, wherein the top and bottom rails each include a pair of longitudinally extending sides and the top rail provides one or more ribs that extend between the longitudinally extending sides of the top rail, and wherein one or more electronic components are mounted on at least one of the top and bottom sides of the circuit board, and mitigating vibration on the circuit board with one or more damping pads interposing the circuit board and the host downhole tool, the one or more damping pads being positioned such that contact between the circuit board and the host downhole tool is prevented.

Each of embodiments A, B, and C may have one or more of the following additional elements in any combination: Element 1: wherein the top rail is removably coupled to the bottom rail using one or more mechanical fasteners. Element 2: wherein the top and bottom rails comprise a material selected from the group consisting of a metal, a plastic, a thermoplastic, a polymer, a composite material, a ceramic, a material impregnated with either conductive particles or magnetically permeable particles, and any combination thereof. Element 3: wherein a structural intersection of the one or more ribs and the longitudinally extending sides of the top rail defines one or more cells in the top rail, the downhole electronics assembly further comprising a cell damper assembly positionable within one of the one or more cells, the cell damper assembly including a molded pad positionable about at least one of the one or more electronic components and a lid that secures the molded pad within the one of the one or more cells. Element 4: wherein the molded pad comprises a material selected from the group consisting of rubber, an elastomer, polyurethane, epoxy, adhesive, silicone, a silicone-based material, and any combination thereof. Element 5: wherein the one or more damping pads comprise a material selected from the group consisting of rubber, an elastomer, polyurethane, an epoxy, silicone, a silicone-based material, and any combination thereof. Element 6: further comprising an intermediate damping pad that interposes the top rail and the circuit board. Element 7: wherein the intermediate damping pad comprises a plurality of gasket strips that interpose the circuit board and the ribs and the longitudinally extending sides of the top rail such that contact between the circuit board and the top rail is prevented. Element 8: wherein the intermediate damping pad comprises a material selected from the group consisting of rubber, an elastomer, polyurethane, an epoxy, silicone, a silicone-based material, and any combination thereof. Element 9: wherein at least one of the one or more electronic components is secured to one of the one or more ribs.

Element 10: wherein the host downhole tool comprises a receiving element and the at least one modular carrier is mounted on the receiving element. Element 11: wherein the at least one modular carrier is removably coupled to the host downhole tool using one or more mechanical fasteners. Element 12: wherein the top rail is removably coupled to the bottom rail using one or more mechanical fasteners. Element 13: wherein a structural intersection of the one or more ribs and the longitudinally extending sides of the top rail define one or more cells in the top rail, the downhole electronics assembly further comprising a cell damper assembly positionable within one of the one or more cells, the cell damper assembly including a molded pad positionable about at least one of the one or more electronic components and a lid that secures the molded pad within the one of the one or more cells. Element 14: wherein the one or more damping pads comprise a material selected from the group consisting of rubber, an elastomer, polyurethane, an epoxy, silicone, a silicone-based material, and any combination thereof. Element 15: further comprising an intermediate damping pad that interposes the top rail and the circuit board, the intermediate damping pad comprising a material selected from the group consisting of rubber, an elastomer, polyurethane, an epoxy, silicone, a silicone-based material, and any combination thereof.

Element 16: wherein the host downhole tool includes a receiving element, the method further comprising mounting the modular carrier on the receiving element. Element 17: further comprising removably coupling the modular carrier to the host downhole tool using one or more mechanical fasteners. Element 18: further comprising removably coupling the top rail to the bottom rail using one or more mechanical fasteners. Element 19: further comprising conducting thermal energy away from the circuit board and to the host downhole tool with the one or more damping pads. Element 20: further comprising electrically isolating the circuit board from the host downhole tool with the one or more damping pads. Element 21: wherein a structural intersection of the one or more ribs and the longitudinally extending sides of the top rail define one or more cells in the top rail, the method further comprising positioning a cell damper assembly within one of the one or more cells, the cell damper assembly including a molded pad positionable about at least one of the one or more electronic components and a lid that secures the molded pad within the one of the one or more cells. Element 22: further comprising conducting thermal energy away from the at least one of the one or more electronic components with the molded pad. Element 23: further comprising mitigating vibration on the circuit board with an intermediate damping pad that interposes the top rail and the circuit board. Element 24: further comprising coupling the top rail to the bottom rail with the circuit board positioned therebetween, and placing a compressive load on the circuit board with the intermediate damping pad and the one or more damping pads. Element 25: further comprising conducting thermal energy away from the circuit board with the intermediate damping pad. Element 26: further comprising mitigating electrostatic discharge on the circuit board with the modular carrier. Element 27: further comprising accessing the one or more electronic components on at least one of the top and bottom sides of the circuit board when the circuit board is secured between the top and bottom rails. Element 28: further comprising securing at least one of the one or more electronic components to one of the one or more ribs, and dissipating thermal energy from the at least one of the one or more electronic components into the one of the one or more ribs.

By way of non-limiting example, exemplary combinations applicable to A, B, C include: Element 3 with Element 4; Element 6 with Element 7; Element 6 with Element 8; Element 21 with Element 22; Element 23 with Element 24; and Element 24 with Element 25.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The use of directional terms such as above, below, upper, lower, upward, downward, left, right, uphole, downhole and the like are used in relation to the illustrative embodiments as they are depicted in the figures, the upward direction being toward the top of the corresponding figure and the downward direction being toward the bottom of the corresponding figure, the uphole direction being toward the surface of the well and the downhole direction being toward the toe of the well.

What is claimed is:

1. An electronics assembly suitable for downhole use, comprising:
    a modular carrier including a top rail and a bottom rail, the top and bottom rails each including a pair of longitudinally extending sides and the top rail providing one or more ribs that extend between the longitudinally extending sides of the top rail;
    a circuit board positionable between the top and bottom rails, the circuit board having a top side and a bottom side and one or more electronic components mounted on at least one of the top and bottom sides; and
    one or more damping pads configured to interpose the circuit board and at least one of the one or more ribs such that contact between the circuit board and the top rail is prevented.

2. The electronics assembly of claim 1, wherein the top and bottom rails comprise a material selected from the group consisting of a metal, a plastic, a thermoplastic, a polymer, a composite material, a ceramic, a material impregnated with either conductive particles or magnetically permeable particles, and any combination thereof.

3. The electronics assembly of claim 1, wherein a structural intersection of the one or more ribs and the longitudinally extending sides of the top rail defines one or more cells in the top rail, the downhole electronics assembly further comprising:
    a cell damper assembly positionable within one of the one or more cells, the cell damper assembly including a molded pad positionable about at least one of the one or more electronic components and a lid that secures the molded pad within the one of the one or more cells.

4. The electronics assembly of claim 3, wherein the molded pad comprises a material selected from the group consisting of rubber, an elastomer, polyurethane, epoxy, adhesive, silicone, a silicone-based material, and any combination thereof.

5. The electronics assembly of claim 1, wherein the one or more damping pads comprise a material selected from the group consisting of rubber, an elastomer, polyurethane, an epoxy, silicone, a silicone-based material, and any combination thereof.

6. The electronics assembly of claim 1, further comprising an intermediate damping pad that interposes the top rail and the circuit board.

7. The electronics assembly of claim 6, wherein the intermediate damping pad comprises a plurality of gasket strips that interpose the circuit board and the ribs and the longitudinally extending sides of the top rail such that contact between the circuit board and the top rail is prevented.

8. The electronics assembly of claim 6, wherein the intermediate damping pad comprises a material selected from the group consisting of rubber, an elastomer, polyurethane, an epoxy, silicone, a silicone-based material, and any combination thereof.

9. The electronics assembly of claim 1, wherein at least one of the one or more electronic components is secured to one of the one or more ribs.

10. A well system, comprising:
a tool string extendable within a wellbore, the tool string including a host downhole tool;
at least one modular carrier mounted to the host downhole tool and including a top rail and a bottom rail, the top and bottom rails each including a pair of longitudinally extending sides and the top rail providing one or more ribs that extend between the longitudinally extending sides of the top rail;
a circuit board secured between the top and bottom rails and having a top side and a bottom side, wherein one or more electronic components are mounted on at least one of the top and bottom sides; and
one or more damping pads interposing the circuit board and at least one of the one or more ribs such that contact between the circuit board and the top rail is prevented.

11. The well system of claim 10, wherein a structural intersection of the one or more ribs and the longitudinally extending sides of the top rail define one or more cells in the top rail, the host downhole tool further comprising:
a cell damper assembly positionable within one of the one or more cells, the cell damper assembly including a molded pad positionable about at least one of the one or more electronic components and a lid that secures the molded pad within the one of the one or more cells.

12. A method, comprising:
introducing a tool string into a wellbore, the tool string including a host downhole tool;
providing electronic support for the tool string with a downhole electronics assembly mounted to the host downhole tool, the downhole electronics assembly including a modular carrier having a top rail and a bottom rail, and a circuit board secured between the top and bottom rails and having a top side and a bottom side, wherein the top and bottom rails each include a pair of longitudinally extending sides and the top rail provides one or more ribs that extend between the longitudinally extending sides of the top rail, and wherein one or more electronic components are mounted on at least one of the top and bottom sides of the circuit board; and
mitigating vibration on the circuit board with one or more damping pads interposing the circuit board and at least one of the one or more ribs, the one or more damping pads being positioned such that contact between the circuit board and the top rail is prevented.

13. The method of claim 12, further comprising conducting thermal energy away from the circuit board and to the host downhole tool with the one or more damping pads.

14. The method of claim 12, further comprising electrically isolating the circuit board from the host downhole tool with the one or more damping pads.

15. The method of claim 12, wherein a structural intersection of the one or more ribs and the longitudinally extending sides of the top rail define one or more cells in the top rail, the method further comprising:
positioning a cell damper assembly within one of the one or more cells, the cell damper assembly including a molded pad positionable about at least one of the one or more electronic components and a lid that secures the molded pad within the one of the one or more cells; and
conducting thermal energy away from the at least one of the one or more electronic components with the molded pad.

16. The method of claim 12, further comprising mitigating vibration on the circuit board with an intermediate damping pad that interposes the top rail and the circuit board.

17. The method of claim 16, further comprising:
coupling the top rail to the bottom rail with the circuit board positioned therebetween; and
placing a compressive load on the circuit board with the intermediate damping pad and the one or more damping pads.

18. The method of claim 16, further comprising conducting thermal energy away from the circuit board with the intermediate damping pad.

19. The method of claim 12, further comprising accessing the one or more electronic components on at least one of the top and bottom sides of the circuit board when the circuit board is secured between the top and bottom rails.

20. The method of claim 12, further comprising:
securing at least one of the one or more electronic components to one of the one or more ribs; and
dissipating thermal energy from the at least one of the one or more electronic components into the one of the one or more ribs.

* * * * *